(12) United States Patent
Kwon et al.

(10) Patent No.: US 9,368,747 B2
(45) Date of Patent: Jun. 14, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Jae-Joong Kwon, Yongin (KR); Ha-Young Lee, Yongin (KR); Seung-Hwan Chung, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 113 days.

(21) Appl. No.: 14/244,498

(22) Filed: Apr. 3, 2014

(65) Prior Publication Data
US 2015/0076457 A1  Mar. 19, 2015

(30) Foreign Application Priority Data

Sep. 13, 2013 (KR) .......................... 10-2013-0110628

(51) Int. Cl.
*H01L 51/52* (2006.01)
(52) U.S. Cl.
CPC ............ *H01L 51/5237* (2013.01); *H01L 51/52* (2013.01); *H01L 51/524* (2013.01); *H01L 51/5275* (2013.01); *H01L 51/5265* (2013.01)
(58) Field of Classification Search
CPC ... H01L 51/52; H01L 51/5265; H01L 51/524; H01L 51/5275; H01L 51/5237
See application file for complete search history.

(56) References Cited

U.S. PATENT DOCUMENTS 7,595,586 B2  9/2009  Oh et al.
8,408,960 B2  4/2013  Cho et al.
2008/0284320 A1*  11/2008  Karkkainen ........... B82Y 20/00
                                                    313/504
2011/0007241 A1*  1/2011  Hwang ................ G02B 6/0038
                                                    349/63
2011/0266577 A1  11/2011  Kim et al.
2012/0075557 A1  3/2012  Hong et al.

(Continued)

FOREIGN PATENT DOCUMENTS

KR  1020120077301 A  7/2012
KR  1020130045267 A  5/2013

OTHER PUBLICATIONS

Exceptionally Efficient Organic light Emitting Devices Using High Refractive Index Substrates by Saso Mladenovski, Kristiaan Neyts, Domagoj Pavicic, Angar Werner and Carsten Rothe, Published Apr. 23, 2009/ vol. 17, No. 9/ Optics Express 7562.*

(Continued)

*Primary Examiner* — Bilkis Jahan
*Assistant Examiner* — Nga Doan
(74) *Attorney, Agent, or Firm* — Cantor Colburn LLP

(57) ABSTRACT

An organic light-emitting display apparatus includes a substrate, an organic light-emitting device including a first electrode disposed on the substrate, a second electrode disposed opposite the first electrode, and an intermediate layer disposed between the first and second electrodes, where the intermediate layer includes an organic emission layer, and an encapsulation unit disposed on the organic light-emitting device, where at least one of the substrate and the encapsulation unit, which is disposed in an emission direction of light, includes a region having a first refractive index and a region having a second refractive index greater than the first refractive index, and the region having the first refractive index and the region having the second refractive index include materials having a same chemical formula as each other.

11 Claims, 15 Drawing Sheets

(56) References Cited

U.S. PATENT DOCUMENTS

2013/0001600 A1  1/2013  Lim et al.
2013/0063022 A1  3/2013  Park et al.
2013/0069524 A1  3/2013  Takai et al.
2013/0119357 A1  5/2013  Kim et al.

OTHER PUBLICATIONS

Glasses for Photonic Applications, by Kathleen Richardson, Denise Krol, Kazuyuki Hirao, published Mar. 11, 2010/ vol. 1, Issue 1/ pp. 74-86.*

* cited by examiner

ORGANIC LIGHT-EMITTING DISPLAY APPARATUS AND METHOD OF MANUFACTURING THE SAME

This application claims priority to Korean Patent Application No. 10-2013-0110628, filed on Sep. 13, 2013, and all the benefits accruing therefrom under 35 U.S.C. §119, the content of which in its entirety is herein incorporated by reference.

BACKGROUND

1. Field

One or more exemplary embodiments of the invention relate to an organic light-emitting display apparatus and a method of manufacturing the organic light-emitting display apparatus.

2. Description of the Related Art

An organic light-emitting apparatus is a self-emitting display apparatus that includes a hole injection electrode, an electron injection electrode, and an organic light-emitting device including an organic emission layer formed therebetween. In the organic light-emitting apparatus, holes injected from the hole injection electrode and electrons injected from the electron injection electrode combine in the organic emission layer, thereby generating excitons, and when the excitons decay from an excited state to a ground state, light is emitted.

The organic light-emitting display apparatus does not include a separate light source. Therefore, the organic light-emitting display apparatus is driven with a low voltage and is light and thin. Also, as the organic light-emitting display apparatus has characteristics such as a broad viewing angle, high contrast, short response time, and the organic light-emitting display apparatus are used in personal portable devices, such as MP3 players and portable terminals, to televisions ("TV"s) and so on.

SUMMARY

One or more exemplary embodiments of the invention include an organic light-emitting display apparatus and a method of manufacturing the organic light-emitting display apparatus.

Additional features will be set forth in part in the description which follows and, in part, will be apparent from the description, or may be learned by practice of the presented embodiments.

According to one or more exemplary embodiments of the invention, an organic light-emitting display apparatus includes: a substrate, an organic light-emitting device including a first electrode disposed on the substrate, a second electrode disposed opposite the first electrode, and an intermediate layer disposed between the first and second electrodes, where the intermediate layer includes an organic emission layer; and an encapsulation unit disposed on the organic light-emitting device, where at least one of the substrate and the encapsulation unit, which is disposed in an emission direction of light, includes a region having a first refractive index and a region having a second refractive index greater than the first refractive index, and the region having the first refractive index and the region having the second refractive index include materials having a same chemical formula as each other.

In an exemplary embodiment, the at least one of the substrate and the encapsulation unit which is disposed in the emission direction of the light may include poly(methyl methacrylate) ("PMMA") or glass containing impurities.

In an exemplary embodiment, the impurities may include germanium (Ge) or boron (B).

In an exemplary embodiment, the at least one of the substrate and the encapsulation unit, which is disposed in the emission direction of the light, may further include a region having a third refractive index different from the first and second refractive indexes, and the regions having the first to third refractive indexes may include materials having the same chemical formula as each other.

In an exemplary embodiment, the at least one of the substrate and the encapsulation unit, which is disposed in the emission direction of the light, may include a region, a refractive index of which is substantially continuously changed.

In an exemplary embodiment, a width of the region having the first refractive index may be substantially the same as a width of the region having the second refractive index.

In an exemplary embodiment, a width of the region having the first refractive index may be different from a width of the region having the second refractive index.

In an exemplary embodiment, the intermediate layer may include a resonance distance adjusting layer for adjusting a distance between the first and second electrodes.

In an exemplary embodiment, the first electrode may be a semi-transmissive electrode, the second electrode may be a reflective electrode, and the substrate may include the region having the first refractive index and the region having the second refractive index.

In an exemplary embodiment, the first electrode may be a reflective electrode, the second electrode may be a semi-transmissive electrode, and the encapsulation unit may protect the organic light-emitting device and may include the region having the first refractive index and the region having the second refractive index.

In an exemplary embodiment, each of the first and second electrodes may be a semi-transmissive electrode, and each of the substrate and the encapsulation unit may include the region having the first refractive index and the region having the second refractive index.

According to one or more exemplary embodiments of the invention, a method of manufacturing an organic light-emitting display apparatus includes: providing a substrate; sequentially stacking a first electrode, an intermediate layer including an organic emission layer and a second electrode on the substrate to form an organic light-emitting device; and providing an encapsulation unit on the organic light-emitting device, where at least one of the substrate and the encapsulation unit, which is disposed in an emission direction of light, includes a region having a first refractive index and a region having a second refractive index greater than the first refractive index, and the region having the first refractive index and the region having the second refractive index include materials having a same chemical formula as each other.

In an exemplary embodiment, the at least one of the substrate and the encapsulation unit, which is disposed in the emission direction of the light, may include PMMA or glass containing impurities.

In an exemplary embodiment, the impurities may include germanium (Ge) or boron (B).

In an exemplary embodiment, the method may further include irradiating light on at least one of the substrate and the encapsulation unit using a mask including a light transmitting region, which transmits the light, and a light blocking region, which blocks the light.

In an exemplary embodiment, a width of the light transmitting region may be substantially the same as a width of the light blocking region.

In an exemplary embodiment, a width of the light transmitting region may be different from a width of the light blocking region.

In an exemplary embodiment, the method may further include transmitting light toward at least one of the substrate and the encapsulation unit using a halftone mask including a light transmitting region, which transmits the light, a light blocking region, which blocks the light, and a semi-transmissive region, which transmits a portion of the light.

In an exemplary embodiment, the method may further include transmitting light toward at least one of the substrate and the encapsulation unit using a gradation mask, light transmittance of which is substantially continuously changed.

In an exemplary embodiment, the providing the organic light-emitting device may include providing a resonance distance adjusting layer for adjusting a distance between the first and second electrodes.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
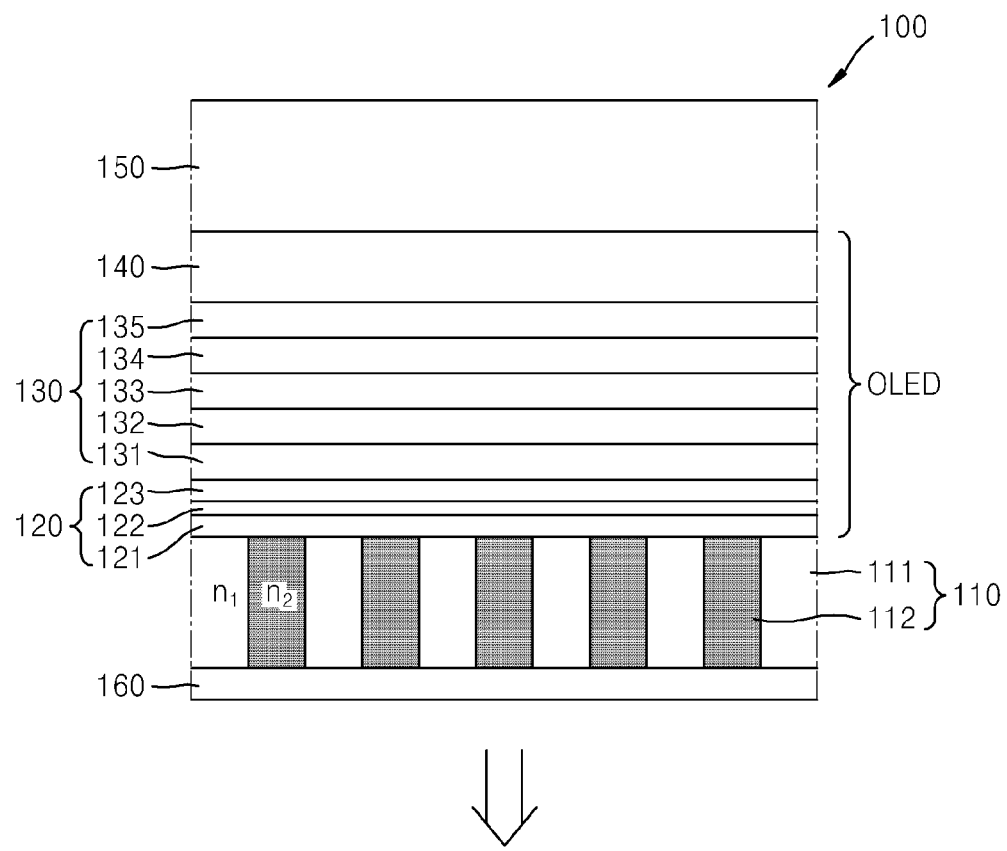
FIG. 1 is a cross-sectional view schematically illustrating an exemplary embodiment of an organic light-emitting display apparatus, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the invention are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

FIG. 1 is a cross-sectional view schematically illustrating an exemplary embodiment of an organic light-emitting display apparatus 100, according to the invention.

Referring to FIG. 1, an exemplary embodiment of the organic light-emitting display apparatus 100, according to the invention, includes an organic light-emitting device OLED disposed on a substrate 110 and an encapsulation unit 150 disposed on the organic light-emitting device OLED. The organic light-emitting device OLED includes a first electrode 120, an intermediate layer 130 including an organic emission layer 133, and a second electrode 140.

The substrate 110 may include poly(methyl methacrylate) ("PMMA") or glass containing impurities. The impurities may include germanium (Ge) or boron (B).

The substrate 110 may include a region 111 having a first refractive index $n_1$ and a region 112 having a second refractive index $n_2$.

In an exemplary embodiment, the substrate 110 may be formed of a single compound. In such an embodiment, the region 111 having the first refractive index $n_1$ and the region 112 having the second refractive index $n_2$ are respectively formed of materials having the same chemical formula, having different chemical bonding structures, such that the regions 111 and 112 have different refractive indexes. This will be described below.

The first electrode 120 of the organic light-emitting device OLED is disposed on the substrate 110. The first electrode 120 may include transparent electrodes 121 and 123, including a transparent conductive material, and a semi-transmissive layer 122 that forms a microcavity along with the second electrode 140.

In such an embodiment, the first electrode 120 may have a structure in which a first transparent electrode 121, the semi-transmissive layer 122 and a second transparent electrode 123 are sequentially stacked on the substrate 110. The first and second transparent electrodes 121 and 123 may include indium tin oxide ("ITO"), indium zinc oxide ("IZO"), zinc oxide (ZnO), indium oxide ($In_2O_3$), indium gallium oxide ("IGO"), aluminum zinc oxide ("AZO") or a combination thereof, and the semi-transmissive layer 122 may include a thin film of several nanometers (nm) to several tens of nanometers and may include silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb) or a combination thereof.

The intermediate layer 130 is disposed on the first electrode 120 and may include an organic emission layer 133. The intermediate layer 130 may further include a hole injection layer ("HIL") 131, a hole transport layer ("HTL") 132, an electron transport layer ("ETL") 134, and an electron injection layer ("EIL") 135. However, the embodiment is not limited thereto, and the intermediate layer 130 may include the organic emission layer 133 and other various function layers.

The second electrode 140 is disposed on the intermediate layer 130. The second electrode 140 may include a reflective electrode, and may include Ag, Al, Mg, Li, Ca, Cu, LiF/Ca, LiF/Al, MgAg, CaAg or a combination thereof.

The organic emission layer 133 emits red, green or blue light. Light emitted toward the second electrode 140 is reflected by the second electrode 140, passes through the first electrode 120, which is a semi-transmissive electrode, and is transmitted to the substrate 110.

In such an embodiment, the organic light-emitting display apparatus 100 may be a bottom emission type display apparatus that transmits light toward the substrate 110.

The light emitted from the organic emission layer 133 travels in all directions. In such an embodiment, the light traveling toward the second electrode 140 is reflected and travels toward the first electrode 120.

Some of the light emitted from the organic emission layer 133 and traveling toward the first electrode 120 is reflected by the semi-transmissive layer 122 included in the first electrode 120 and travels toward the second electrode 140. The other light travels toward the substrate 110, and is emitted to the outside.

Accordingly, in such an embodiment, some of the light emitted from the organic emission layer 133 shuttles between the first and second electrodes 120 and 140. Only light of a specific wavelength satisfying a constructive interference condition is amplified, and is transmitted to the substrate 110.

The semi-transmissive layer 122 included in the first electrode 120 and the second electrode 140 that is the reflective electrode form the microcavity, thereby substantially increasing light emission efficiency and a color purity.

The intermediate layer 130 included in the organic light-emitting display apparatus 100 may include a resonance distance adjusting layer for adjusting a distance between the first and second electrodes 120 and 140, and the HTL 132 may function as the resonance distance adjusting layer.

In such an embodiment, the organic emission layer 133 emits red, green and blue light having a relatively broad wavelength width. The light is changed to light having a narrow wavelength width by the microcavity, and is emitted to the outside.

In such an embodiment, a wavelength of the light emitted to the outside is determined based on a distance between the first electrode 120 and the second electrode 140. By adjusting the distance between the first electrode 120 and the second electrode 140 using the resonance distance adjusting layer, light of a predetermined or desired wavelength is emitted to the outside.

In such an embodiment, light of a specific wavelength corresponding to a desired resonance distance is emitted substantially to the normal direction with respect to a front surface of the organic light-emitting display apparatus 100, while light emitted to the oblique direction with the normal direction shuttles along a distance longer than the shortest distance between the first electrode 120 and the second electrode 140, thereby causing constructive interference.

In such an embodiment, a resonance distance of the light emitted to the oblique direction differs from a resonance distance of the light emitted substantially to the normal direction, and thus, a wavelength of the light emitted to the oblique direction differs from a wavelength of the light emitted substantially to the normal direction with respect to a front surface.

In an exemplary embodiment, as described above, the substrate 110 in the organic light-emitting display apparatus 100 includes the region 111 having the first refractive index $n_1$ and the region 112 having the second refractive index $n_2$, such that light, which passes through the first electrode 120 and is incident on the substrate 110 at a certain angle with respect to the front, is emitted in different directions by the substrate 110.

Accordingly, an exemplary embodiment of the organic light-emitting display apparatus 100 decreases a color shift caused by a viewing angle of the organic light-emitting display apparatus 100. In such an embodiment, the organic light-emitting display apparatus 100 decreases a degree of dependency on an angle of a wavelength of emitted light and a reduction in luminance due to the viewing angle.

In an exemplary embodiment, the encapsulation unit 150 is disposed on the second electrode 140, and the encapsulation unit 150 seals and protects the organic light-emitting device OLED. The encapsulation unit 150 may be a glass substrate, a plastic substrate, a metal substrate or a thin film encapsulation in which an organic insulating layer and an inorganic insulating layer are alternately disposed.

The organic light-emitting display apparatus 100 may further include an optical member 160, which is disposed at a surface through which light is emitted, e.g., an outer surface of the substrate 110. The optical member 160 may include a phase retarder or a polarizer, for example, and effectively prevent external light incident on the organic light-emitting display apparatus 100 from being reflected, thus enhancing a visibility and contrast of the organic light-emitting display apparatus 100.

Figure 2:
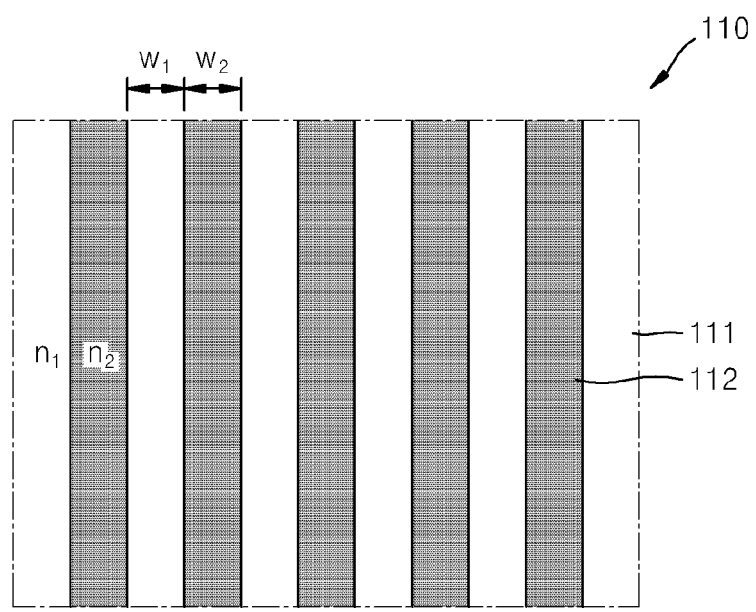
FIG. 2 is a plan view schematically illustrating a substrate in the organic light-emitting display apparatus of FIG. 1.

FIG. 2 is a plan view schematically illustrating an exemplary embodiment of a substrate in the organic light-emitting display apparatus of FIG. 1.

FIG. 2 illustrates a region of the substrate 110 corresponding to a sub-pixel in the organic light-emitting display apparatus 100. As described above, an exemplary embodiment of the substrate 110 may include the region 111 having the first refractive index $n_1$ and the region 112 having the second refractive index $n_2$.

The substrate 110 may include PMMA or glass containing impurities. The impurities may include Ge or B.

When light is irradiated to the substrate including the glass containing the impurities, a bonding structure of elements forming the substrate 110 is changed based on an intensity and irradiation time of the irradiated light, thereby changing a refractive index.

In an exemplary embodiment, the region 111 having the first refractive index $n_1$ and the region 112 having the second refractive index $n_2$ may be respectively formed of compounds that have different bonding structures and substantially the same chemical formula.

In such an embodiment of the substrate 110, as shown in FIG. 2, the region 111 having the first refractive index $n_1$ and the region 112 having the second refractive index $n_2$ may be alternately disposed in a stripe form, and a width $W_1$ of the region 111 having the first refractive index $n_1$ may be substantially the same as a width $W_2$ of the region 112 having the second refractive index $n_2$.

Figure 3:
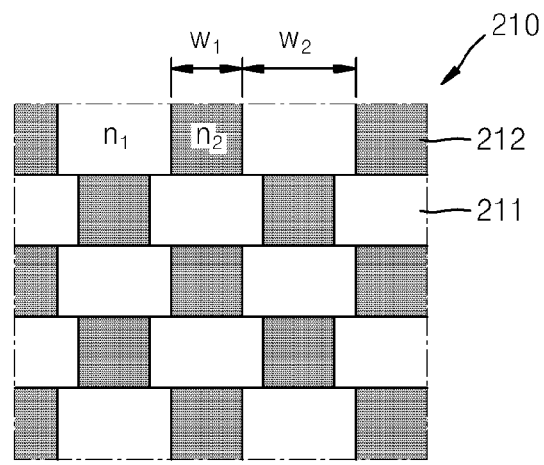
FIGS. 3 and 4 are plan views schematically illustrating alternative exemplary embodiments of the substrate in an organic light-emitting display apparatus, according to the invention.
Figure 4:
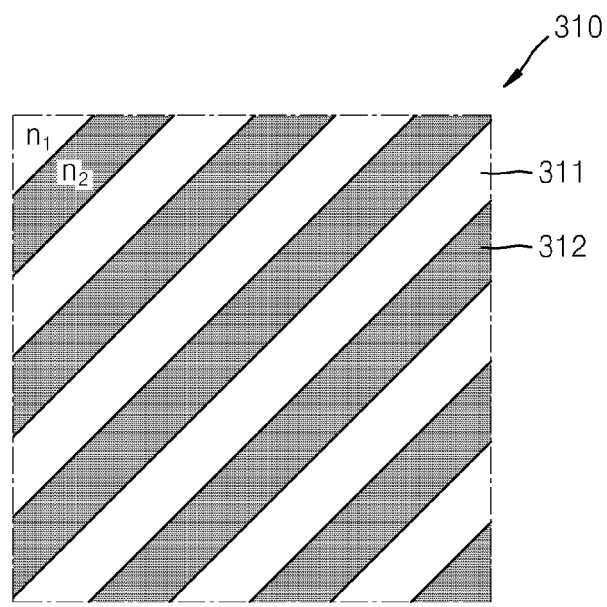

FIGS. 3 and 4 are plan views schematically illustrating alternative exemplary embodiments of the substrate in an organic light-emitting display apparatus, according to the invention.

FIG. 3 illustrates a region of an exemplary embodiment of a substrate 210 corresponding to a sub-pixel in an organic light-emitting display apparatus, according to the invention. The substrate 210 may include a region 211 having a first refractive index $n_1$ and a region 212 having a second refractive index $n_2$.

In an exemplary embodiment of the substrate 210, as shown in FIG. 3, the region 211 having the first refractive index $n_1$ and the region 212 having the second refractive index $n_2$ may be alternately disposed in a checkered shape, and a width $W_1$ of the region 211 having the first refractive index $n_1$ may differ from a width $W_2$ of the region 212 having the second refractive index $n_2$.

FIG. 4 illustrates a region of another alternative exemplary embodiment of a substrate 310 corresponding to a sub-pixel in an organic light-emitting display apparatus, according to the invention. In such an embodiment, the substrate 310 may include a region 311 having a first refractive index $n_1$ and a region 312 having a second refractive index $n_2$.

In such an embodiment of the substrate 310, as shown in FIG. 4, the region 311 having the first refractive index $n_1$ and the region 312 having the second refractive index $n_2$ may extend substantially in a diagonal direction and may be alternately disposed.

A width of the region 311 having the first refractive index $n_1$ may be equal to or may be different from a width of the region 312 having the second refractive index $n_2$. Here, the width of the regions 311 or 312 may be defined as a length in a direction substantially perpendicular to an extending direction thereof.

Figure 5:
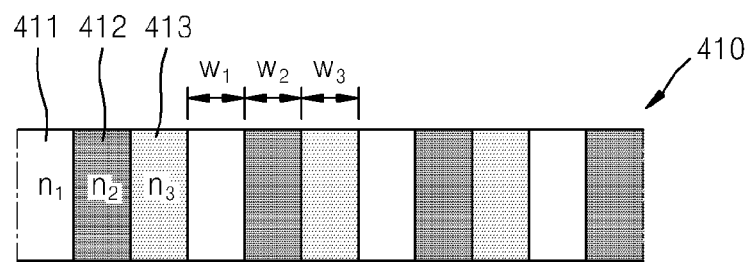
FIGS. 5 to 7 are cross-sectional views schematically illustrating other alternative exemplary embodiments of the substrate in an organic light-emitting display apparatus, according to the invention.
Figure 6:
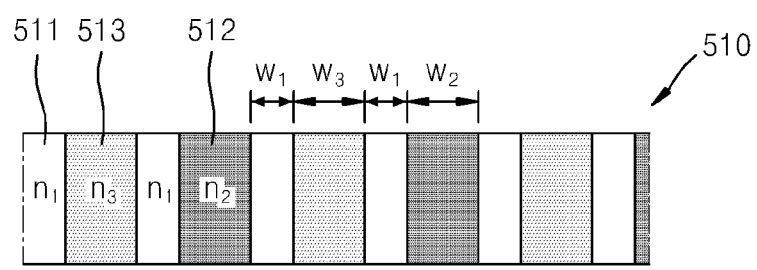
Figure 7:
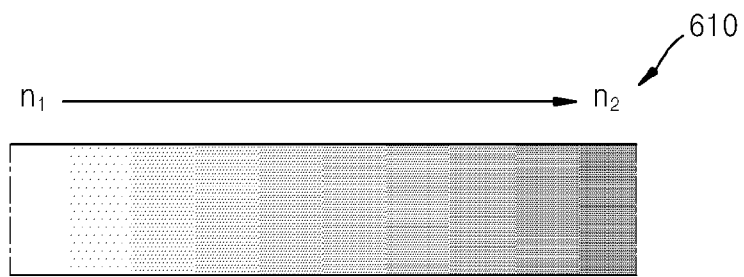

FIGS. 5 to 7 are cross-sectional views schematically illustrating other alternative exemplary embodiments of the substrate in an organic light-emitting display apparatus, according to the invention.

FIG. 5 illustrates a region of another alternative exemplary embodiment of a substrate 410 in an organic light-emitting display apparatus, according to the invention. The substrate 410 may include a region 411 having a first refractive index $n_1$, a region 412 having a second refractive index $n_2$, and a region 413 having a third refractive index $n_3$.

The third refractive index n3 may be greater than the first refractive index n1 and less than the second refractive index n2. The region 411 having the first refractive index n1, the region 412 having the second refractive index n2, and the region 413 having the third refractive index n3 may be formed of materials having the same chemical formula.

A width $W_1$ of the region 411 having the first refractive index $n_1$, a width $W_2$ of the region 412 having the second refractive index $n_2$, and a width $W_3$ of the region 413 having the third refractive index $n_3$ may be substantially equal to one another.

In such an embodiment, the substrate 410 includes three regions having different refractive indexes, but the invention is not limited thereto. In an alternative exemplary embodiment, the substrate in an organic light-emitting display apparatus may include four or more regions having different refractive indexes.

FIG. 6 illustrates a region of another alternative exemplary embodiment of a substrate 510 in an organic light-emitting display apparatus, according to the invention. The substrate 510 may include a region 511 having a first refractive index $n_1$, a region 512 having a second refractive index $n_2$, and a region 513 having a third refractive index $n_3$.

The third refractive index n3 may be greater than the first refractive index n1 and less than the second refractive index n2.

A width $W_1$ of the region 511 having the first refractive index $n_1$, a width $W_2$ of the region 512 having the second refractive index $n_2$, and a width $W_3$ of the region 513 having the third refractive index $n_3$ may be different from one another. Widths $W_1$ of a plurality of the regions 511 having the first refractive index $n_1$, which are disposed at different positions, may be equal to or may different from one another. Widths $W_2$ of a plurality of the regions 512 having the second refractive index $n_2$, which are disposed at different positions, may be equal to or different from one another. Widths $W_3$ of a plurality of the regions 513 having the third refractive index $n_3$, which are disposed at different positions, may be equal to or different from one another.

In such an embodiment, the order of arranging the region 511 having the first refractive index $n_1$, the region 512 having the second refractive index $n_2$, and the region 513 having the third refractive index $n_3$ are not limited to the arrangement shown in FIG. 6, and may be variously modified.

FIG. 7 illustrates a region of an exemplary embodiment of a substrate 610 in an organic light-emitting display apparatus, according to the invention. In such an embodiment, the substrate 610 may have a refractive index that is substantially continuously changed, e.g., from the first refractive index $n_1$ to the second refractive index $n_2$, in a predetermined direction.

The refractive index of the substrate 610 may be greater than or equal to the first refractive index $n_1$ and less than or equal to the second refractive index $n_2$.

Exemplary embodiments of the substrate 110 to 610 in an organic light-emitting display apparatus are shown in FIGS. 2 to 7, but not being limited thereto. In another alternative exemplary embodiment, a substrate in an organic light-emitting display apparatus may be implemented in various ways.

Figure 8:
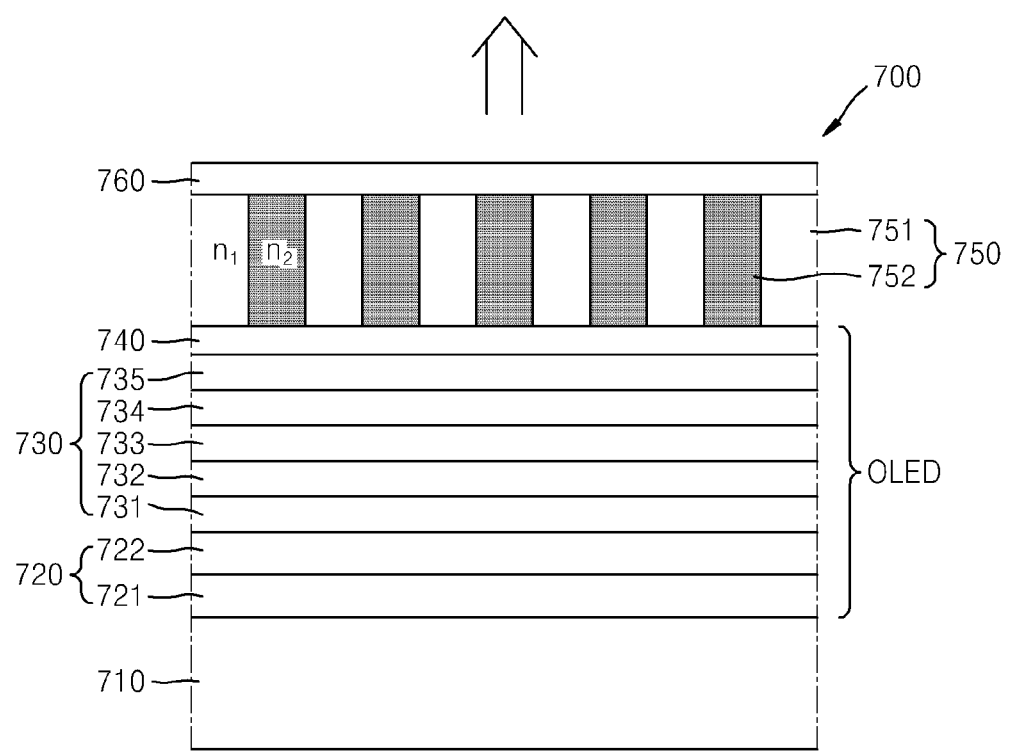
FIG. 8 is a cross-sectional view schematically illustrating an alternative exemplary embodiment of an organic light-emitting display apparatus, according to the invention.

FIG. 8 is a cross-sectional view schematically illustrating an alternative exemplary embodiment of an organic light-emitting display apparatus 700, according to the invention.

Referring to FIG. 8, an exemplary embodiment of the organic light-emitting display apparatus 700, according to the invention, includes an organic light-emitting device OLED disposed on a substrate 710 and an encapsulation unit 750 disposed on the organic light-emitting device OLED. The organic light-emitting device OLED includes a first electrode 720, an intermediate layer 730 including an organic emission layer 733, and a second electrode 740.

The substrate 710 may be a glass substrate or a plastic substrate, and the first electrode 720 of the organic light-emitting device OLED is disposed on the substrate 710. The first electrode 720 may be a reflective electrode, and may include a reflective layer 721, which includes Ag, Mg, Al, Pt, Pd, Au, Ni, Nd, Ir, Cr, or a combination thereof, and a transparent/semitransparent electrode layer 722 disposed on the reflective layer 721.

The transparent/semitransparent electrode layer 722 may include ITO, IZO, ZnO, $In_2O_3$, IGO, AZO or a combination thereof.

The intermediate layer 730 is disposed on the first electrode 720. The intermediate layer 730 may include an organic emission layer 733, and may further include an HIL 731, an HTL 732, an ETL 734 and an EIL 735. However, the embodiment is not limited thereto, and the intermediate layer 730 may include the organic emission layer 733 and other various function layers. The HTL 732 may function as a resonance distance adjusting layer.

The second electrode 740 is disposed on the intermediate layer 730. The second electrode 740 may be a semi-transmissive electrode, and may include Ag, Al, Mg, Li, Ca, Cu, LiF/Ca, LiF/Al, MgAg, CaAg or a combination thereof. The second electrode 740 may include a thin film of several nanometers to several tens of nanometers.

The organic emission layer 733 emits red, green or blue light. Light emitted toward the first electrode 720 is reflected by the first electrode 720, passes through the second electrode 740 that is a semi-transmissive electrode, and is emitted toward the encapsulation unit 750.

In such an embodiment, the organic light-emitting display apparatus 700 may be a top-emission type display apparatus that transmits light toward the encapsulation unit 750.

In such an embodiment, the organic light-emitting display apparatus 700 may include a microcavity defined by the first electrode 720 and the second electrode 740. A path of light emitted from the organic emission layer 733 is substantially similar to the light path of the organic light-emitting display apparatus 100 of FIG. 1.

When light is emitted from the organic emission layer 733, due to a resonance distance difference, a wavelength of light that is transmitted toward the encapsulation unit 750 and emitted substantially to the normal direction with respect to a front surface of organic light-emitting display apparatus 700 may differ from a wavelength of light that is transmitted toward the encapsulation unit 750 and emitted to the oblique direction with the normal direction of organic light-emitting display apparatus 700.

In such an embodiment, the encapsulation unit 750 in the organic light-emitting display apparatus 700 includes a region 751 having a first refractive index $n_1$ and a region 752 having a second refractive index $n_2$ such that light that passes through the second electrode 740 and is incident on the encapsulation unit 750 at a certain angle with respect to the front is emitted in different directions by the encapsulation unit 750.

Accordingly, in such an embodiment, the organic light-emitting display apparatus 700 decreases a color shift caused by a viewing angle of the organic light-emitting display apparatus 700, that is, decreases a degree of dependency on an angle of a wavelength of emitted light and a reduction in luminance due to the viewing angle.

The encapsulation unit 750 disposed on the second electrode 740 may include PMMA or glass containing impurities. The impurities may include Ge or B.

The region 751 having the first refractive index $n_1$ and the region 752 having the second refractive index $n_2$ are respectively formed of compounds having the same chemical formula having different chemical bonding structures, such that the regions 751 and 752 have different refractive indexes.

In an exemplary embodiment, the organic light-emitting display apparatus 700 may further include an organic layer or an inorganic layer (not shown), which is disposed between the second electrode 740 and the encapsulation unit 750.

An optical member 760 may be disposed at an outer surface of the encapsulation unit 750.

The optical member 760 may include a phase retarder or a polarizer, for example, and effectively prevent external light incident on the organic light-emitting display apparatus 700 from being reflected, thus enhancing a visibility and contrast of the organic light-emitting display apparatus 700.

Figure 9:
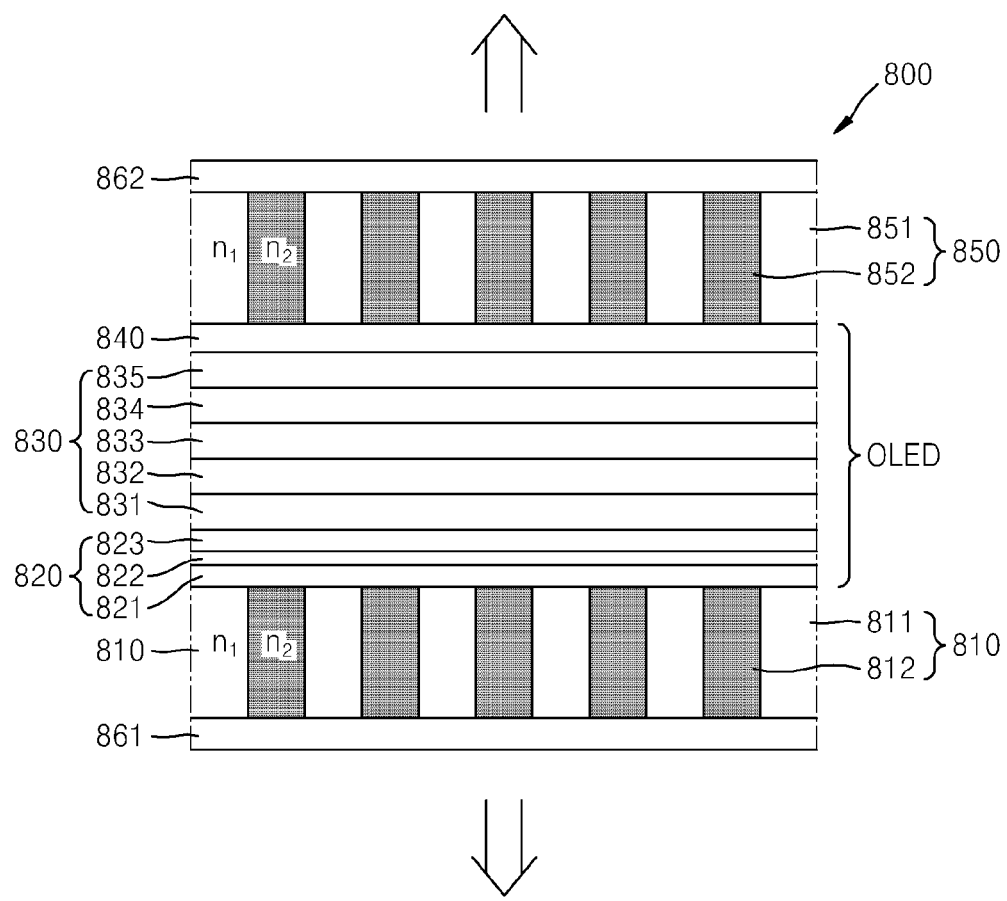
FIG. 9 is a cross-sectional view schematically illustrating another alternative exemplary embodiment of an organic light-emitting display apparatus, according to the invention.

FIG. 9 is a cross-sectional view schematically illustrating another alternative exemplary embodiment of an organic light-emitting display apparatus 800, according to the invention.

Referring to FIG. 9, an exemplary embodiment of the organic light-emitting display apparatus 800, according to the invention, includes an organic light-emitting device OLED is disposed on a substrate 810, and an encapsulation unit 850 disposed on the organic light-emitting device OLED. The organic light-emitting device OLED includes a first electrode 820, an intermediate layer 830 including an organic emission layer 833 and a second electrode 840.

The substrate 810 may include PMMA or glass containing impurities. The impurities may include Ge or B.

The substrate 810 may include a region 811 having a first refractive index $n_1$ and a region 812 having a second refractive index $n_2$.

The substrate 810 is formed of a single compound. In such an embodiment, the region 811 having the first refractive index $n_1$ and the region 812 having the second refractive index $n_2$ are respectively formed of materials having the same chemical formula, but having different chemical bonding structures, such that the regions 811 and 812 have different refractive indexes.

The first electrode 820 of the organic light-emitting device OLED is disposed on the substrate 810. The first electrode 820 may include transparent electrodes 821 and 823 that include a transparent conductive material, and a semi-transmissive layer 822 that forms a microcavity along with the second electrode 840.

In an exemplary embodiment, the first electrode 820 may have a structure, in which a first transparent electrode 821, the semi-transmissive layer 822 and a second transparent electrode 821 are sequentially stacked on the substrate 810. The first and second transparent electrodes 821 and 823 may include ITO, IZO, ZnO, $In_2O_3$, IGO, AZO or a combination thereof, and the semi-transmissive layer 822 may include a thin film of several nanometers to several tens of nanometers. The semi-transmissive layer 822 may include Ag, Mg, Al, Pt, Pd, Au, Ni, Nd, Ir, Cr, Li, Ca, Yb or a combination thereof.

The intermediate layer 830 is disposed on the first electrode 820. The intermediate layer 830 may include an organic emission layer 833, and may further include an HIL 831, an HTL 832, an ETL 834 and an EIL 835. However, the embodiment is not limited thereto, and the intermediate layer 830 may include the organic emission layer 833 and other various function layers. The HTL 832 may function as a resonance distance adjusting layer.

The second electrode 840 is disposed on the intermediate layer 830. The second electrode 840 may be a semi-transmissive electrode, and may include Ag, Al, Mg, Li, Ca, Cu, LiF/Ca, LiF/Al, MgAg, CaAg or a combination thereof. The second electrode 840 may include a thin film of several nanometers to several tens of nanometers.

The organic emission layer 833 emits red, green or blue light. The emitted light may pass through the first and second electrodes 820 and 840, and may be emitted toward the substrate 810 and the encapsulation unit 850.

In such an embodiment, the organic light-emitting display apparatus 800 may be a dual-emission type display apparatus.

In such an embodiment, the organic light-emitting display apparatus 800 may include a microcavity defined by the first electrode 820 and the second electrode 840.

Light emitted from the organic emission layer 833 may be emitted toward the substrate 810 and the encapsulation unit 850. Due to a resonance distance difference, a wavelength of light emitted substantially to the normal direction with respect to a front surface of organic light-emitting display apparatus 800 may differ from a resonance distance of light emitted to the oblique direction with the normal direction of organic light-emitting display apparatus 800.

In an exemplary embodiment, where the substrate 810 included in the organic light-emitting display apparatus 800 includes a region 811 having a first refractive index $n_1$ and a region 812 having a second refractive index $n_2$ and the encapsulation unit 850 in the organic light-emitting display apparatus 800 includes a region 851 having the first refractive index $n_1$ and a region 852 having the second refractive index $n_2$, as described above, light incident on the substrate 810 and the encapsulation unit 850 at a certain angle with respect to the front is emitted in different directions by the substrate 810 and the encapsulation unit 850.

Accordingly, in such an embodiment, the organic light-emitting display apparatus 800 decreases a color shift caused by a viewing angle of the organic light-emitting display apparatus 800, that is, decreases a degree of dependency on an angle of a wavelength of emitted light and a reduction in luminance due to the viewing angle.

The encapsulation unit 850 may include PMMA or glass containing impurities. The impurities may include Ge or B.

The region 851 having the first refractive index $n_1$ and the region 852 having the second refractive index $n_2$ are respectively formed of compounds having the same chemical formula, but having different chemical bonding structures, such that the regions 851 and 852 have different refractive indexes.

An optical member 861 may be disposed at an outer surface of the substrate 810, and an optical member 862 may be disposed at an outer surface of the encapsulation unit 850.

Each of the optical members 861 and 862 may include a phase retarder or a polarizer, for example, and effectively prevent external light incident on the organic light-emitting display apparatus 700 from being reflected, thus enhancing a visibility and contrast of the organic light-emitting display apparatus 800.

Figure 10A:
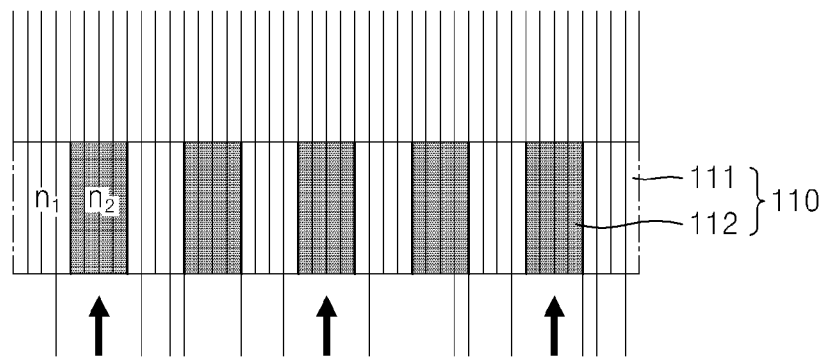
FIGS. 10A and 10C are conceptual views respectively illustrating paths of light incident on a front and side of the substrate of FIG. 2.
Figure 10B:
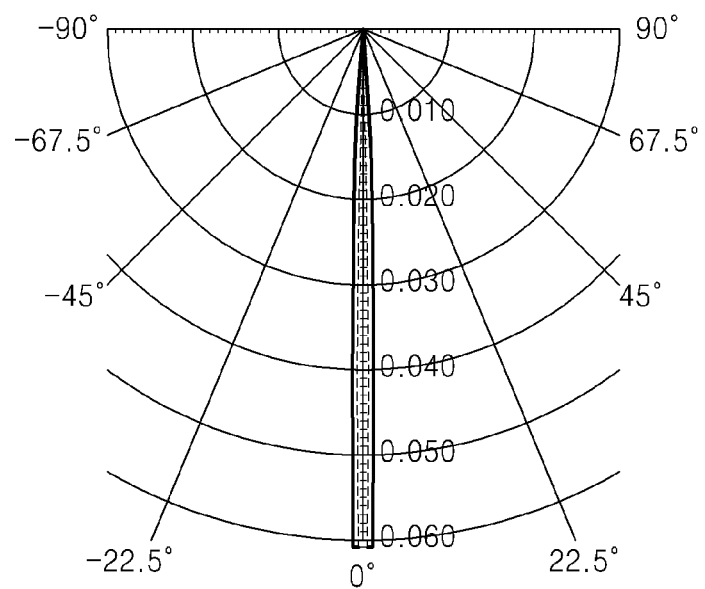
FIGS. 10B and 10D are graphs respectively showing angle distributions of light which is incident on and then passes through the front and side of the substrate of FIG. 2.
Figure 10C:
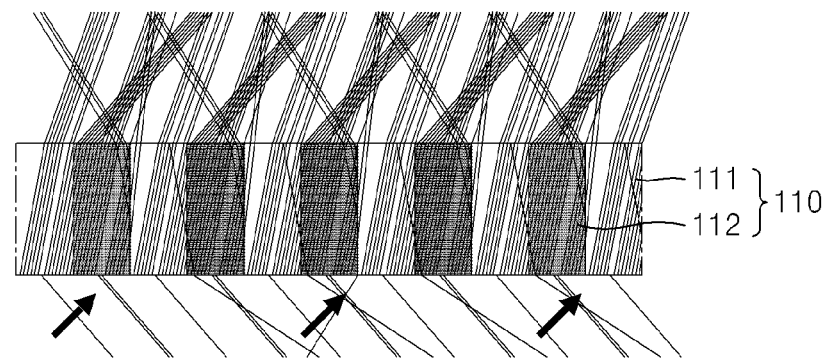
Figure 10D:
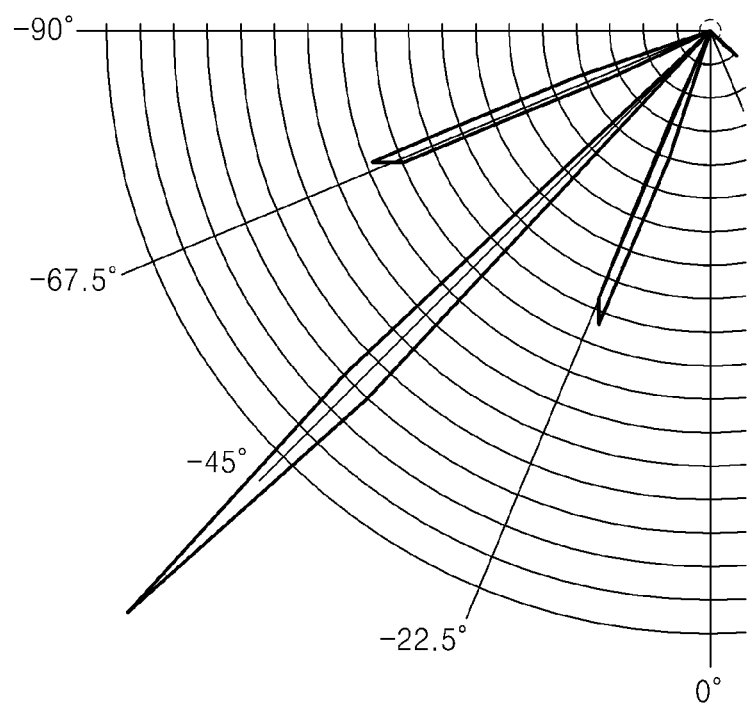

FIGS. 10A and 100 are conceptual views illustrating paths of light incident on the substrate of FIG. 2 substantially in the normal direction and the oblique direction, respectively, and FIGS. 10B and 10D are graphs showing angle distributions of light which is incident on the substrate of FIG. 2 in the normal direction and the oblique direction, respectively, and then passes through the substrate of FIG. 2.

FIGS. 10A and 10C shows simulation results in a case in which a first refractive index is about 1.45 and a second refractive index is about 1.55, and the graphs of FIGS. 10B and 10D are polar coordinate graphs. In each of the graphs of FIGS. 10B and 10D, an angle shown on each graph indicates a degree of slope of a viewing angle with respect to the front along a horizontal direction, and a distance from the center of a circle indicates luminescence intensity. A solid line of each graph indicates light emitted in the horizontal direction of the substrate 110, and a dot line of each graph indicates light emitted in a vertical direction of the substrate 110.

Referring to FIGS. 10A and 10B, light incident on the substrate 110 including the region 111 having the first refractive index $n_1$ and the region 112 having the second refractive index $n_2$ as shown in FIG. 2 substantially in the normal direction is output substantially to the normal direction with respect to the front as the incident direction of the light, and some of the light is reflected by a boundary of the substrate 110.

That is, as shown in FIGS. 10A and 10B, output light is concentrated on the front (zero degree) with respect to light incident on the front (zero degree).

Referring to FIGS. 10A and 10D, light incident on the substrate 110 shown in FIG. 2 in the oblique direction, which is inclined by about 45 degrees with respect to the normal direction, is output in several directions.

Some of light is reflected by the boundary of the substrate 110, and the other light is refracted or reflected by a boundary between the region 111 having the first refractive index $n_1$ and the region 112 having the second refractive index $n_2$. Therefore, light incident on the substrate 110 in the oblique direction is output in several directions due to the above-described factors. FIGS. 10C and 10D show a path, output angle and intensity of light in consideration of only the configuration of the substrate 110. However, in reality, light may be output at more various angles and intensities.

Figure 10E:
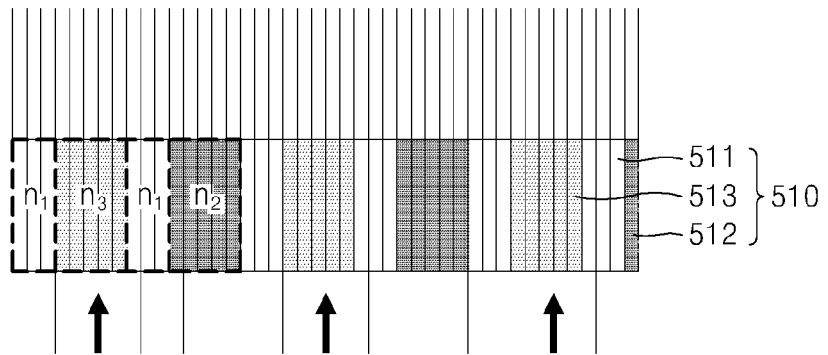
FIGS. 10E and 10G are conceptual views respectively illustrating paths of light incident on a front and side of the substrate of FIG. 6.
Figure 10F:
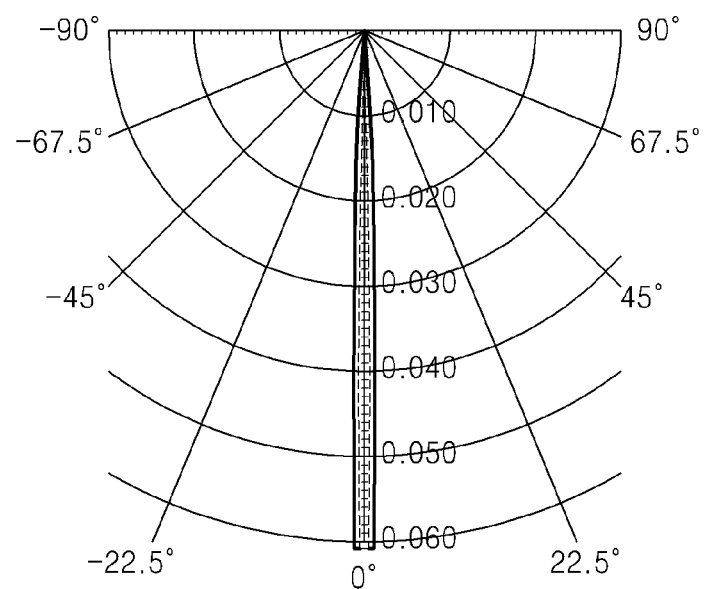
FIGS. 10F and 10H are graphs respectively showing angle distributions of light which is incident on and then passes through the front and side of the substrate of FIG. 6.
Figure 10G:
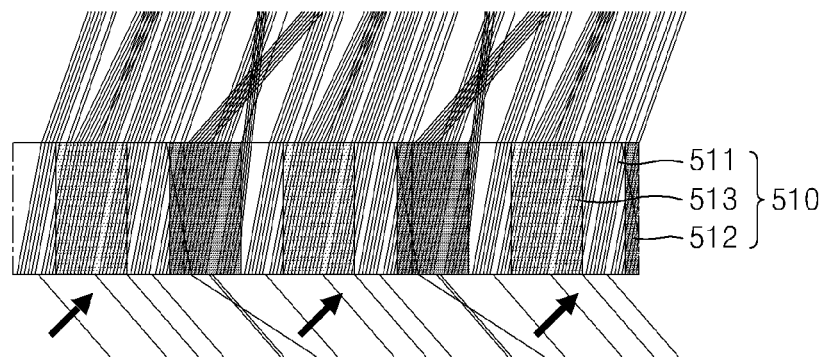
Figure 10H:
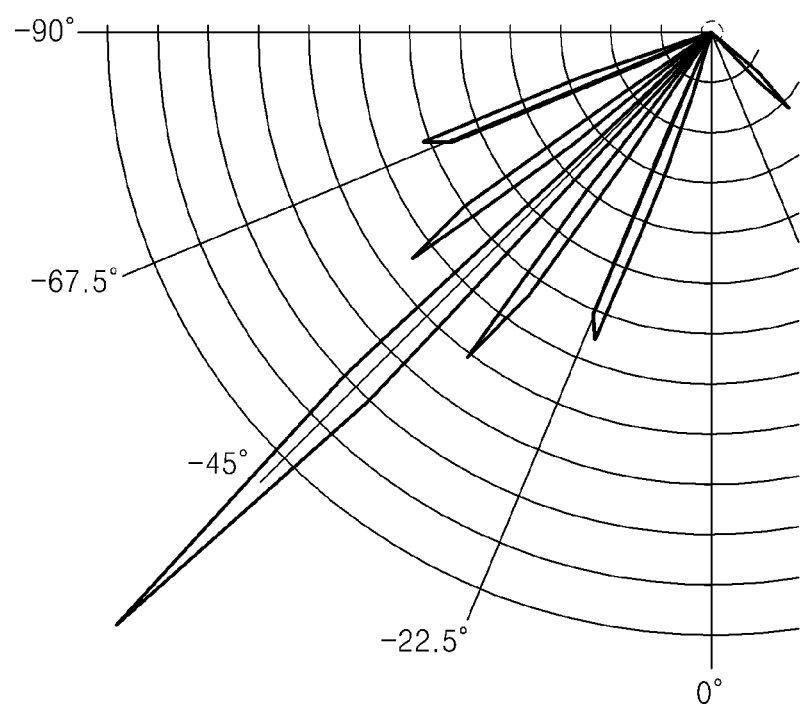
Figure 11A:
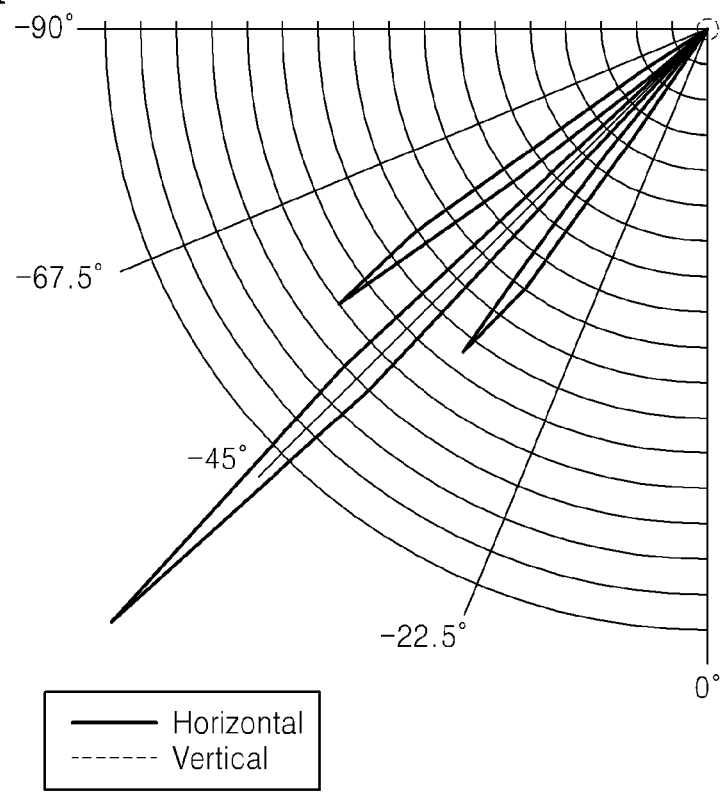
FIGS. 11A to 11E are graphs showing respectively showing angle distributions of light which is incident on and then passes through the substrate, having different second refractive indexes, of FIG. 2.
Figure 11B:
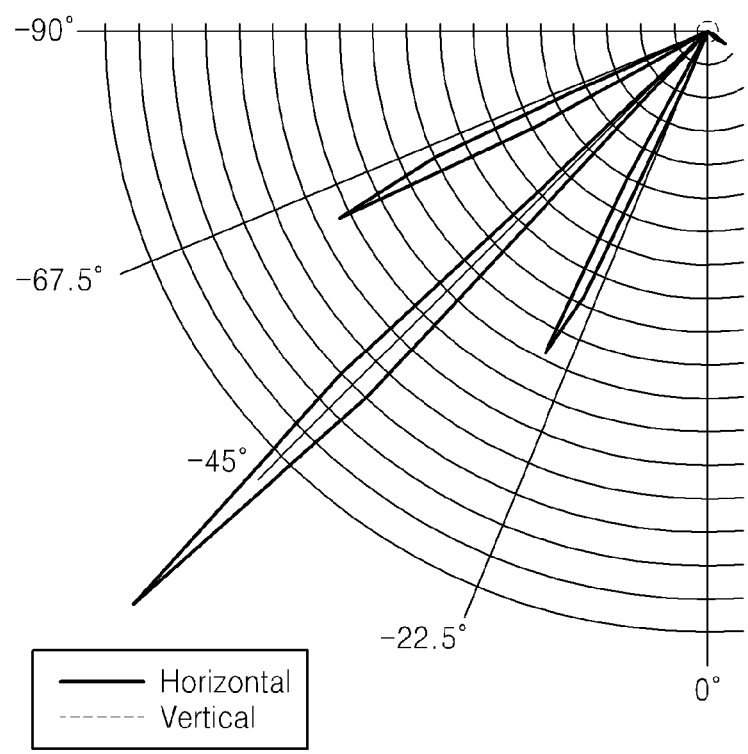
Figure 11C:
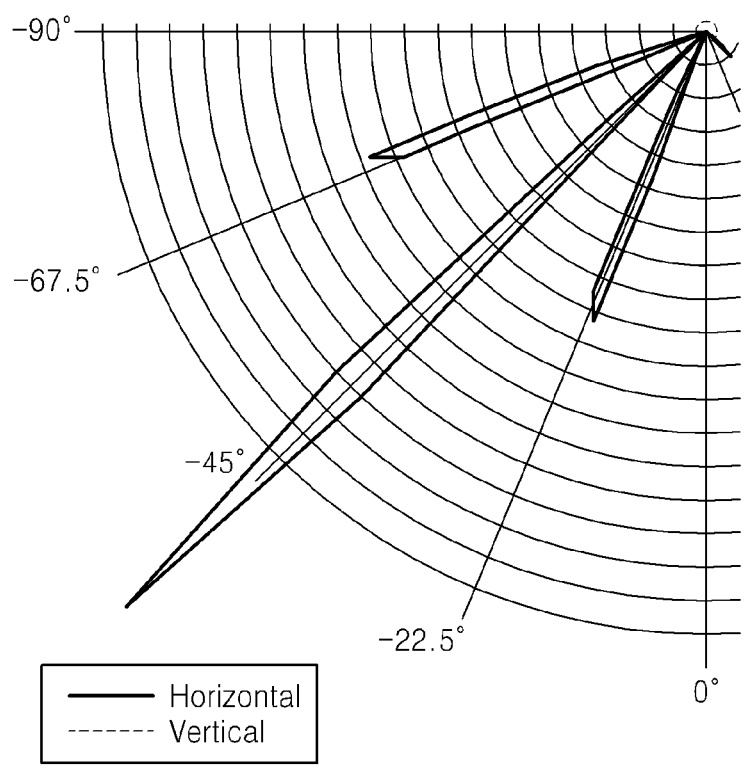
Figure 11D:
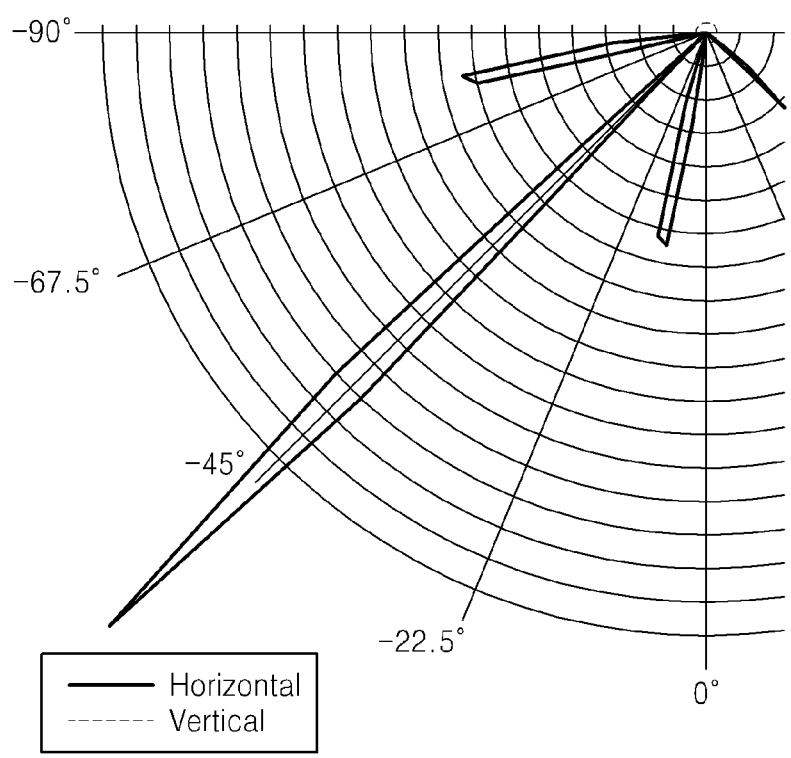
Figure 11E:
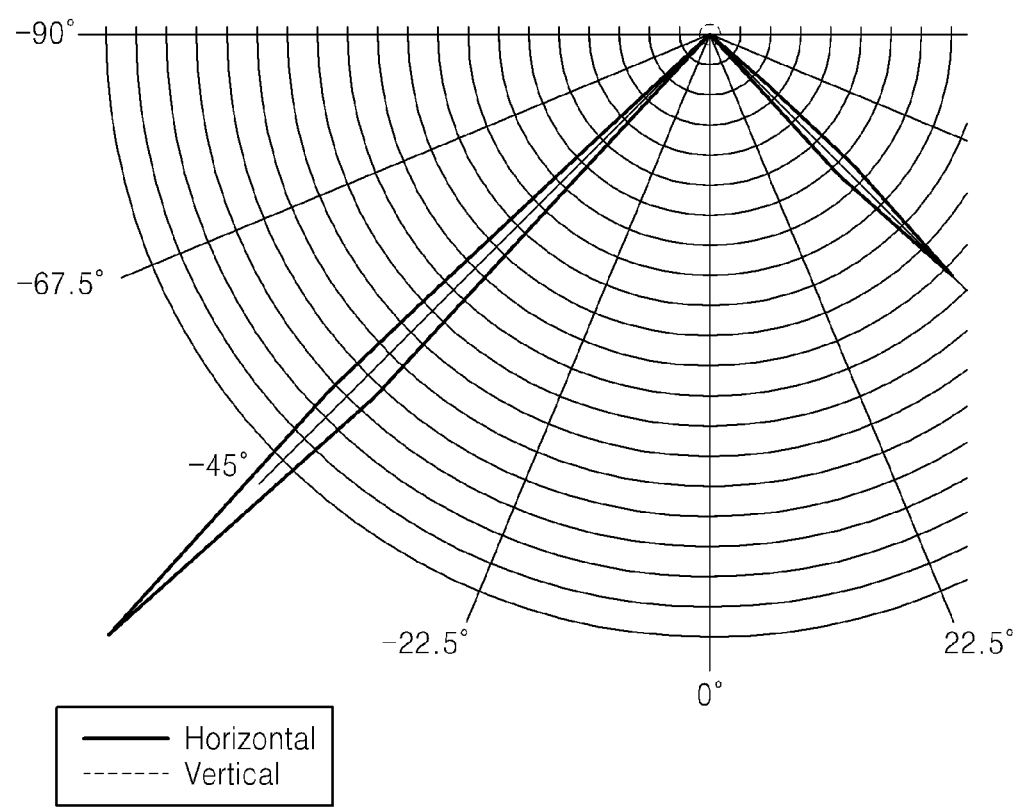

FIGS. 10E and 10G are conceptual views illustrating paths of light incident on the substrate of FIG. 6 in the normal direction and the oblique direction, respectively, and FIGS. 10F and 10H are graphs showing angle distributions of light which is incident on the substrate of FIG. 6 in the normal direction and the oblique direction, respectively, and then passes through the substrate of FIG. 6.

FIGS. 10E and 10G show simulation results in a case in which a first refractive index is about 1.45, a second refractive index is about 1.5, and a third refractive index is about 1.55, and a distance from the center of a circle indicates a luminescence intensity.

Referring to FIGS. 10E and 10F, light incident on the substrate 510 including the region 511 having the first refractive index $n_1$, the region 512 having the second refractive index $n_2$, and the region 513 having the third refractive index $n_3$ as shown in FIG. 6 in the normal direction is output substantially to the normal direction with respect to the front as the incident direction of the light, and some of the light is reflected by a boundary of the substrate 510.

That is, as shown in FIGS. 10E and 10F, output light is concentrated on the front (about zero degree) with respect to light incident on the front (about zero degree).

Referring to FIGS. 10G and 10H, light incident on the substrate 510 in FIG. 6 in the oblique direction, which is inclined by about 45 degrees with respect to the normal direction, is output in several directions.

Some of light is reflected by the boundary of the substrate 510, and the other light is refracted or reflected by a boundary between the region 511 having the first refractive index $n_1$ and the region 512 having the second refractive index $n_2$ and/or a boundary between the region 511 having the first refractive index $n_1$ and the region 513 having the third refractive index $n_3$ unlike in FIG. 10E. The path of incident light in the case of the substrate 510 of FIG. 6 is influenced by more factors than a path of incident light in the case of the second substrate 110 of FIG. 2, and thus, light incident on the substrate 510 in FIG. 6 in the oblique direction is output in more various directions than light incident on the substrate 110 of FIG. 2 in the oblique direction.

FIGS. 10G and 10H show a path, output angle and intensity of light in consideration of only the configuration of the substrate 510. However, in reality, light may be output at more various angles and intensities.

FIGS. 11A to 11E are graphs showing angle distributions of light incident on and then passes through the substrate of FIG. 2 having different second refractive indexes.

FIGS. 11A to 11E are graphs that show an angle and intensity of output light with respect to light incident on the substrate 110 of FIG. 2, where the first refractive index $n_1$ is about 1.45 and the second refractive indexes $n_2$ are about 1.5, about 1.55, about 1.57, about 1.6 and about 1.65, respectively.

As shown in FIGS. 11A to 11E, an angle and intensity of output light may be adjusted by changing the second refractive index $n_2$. As described above, the second refractive index $n_2$ may be variously set by adjusting an intensity and irradiation time of light incident on the substrate 110.

Figure 12:
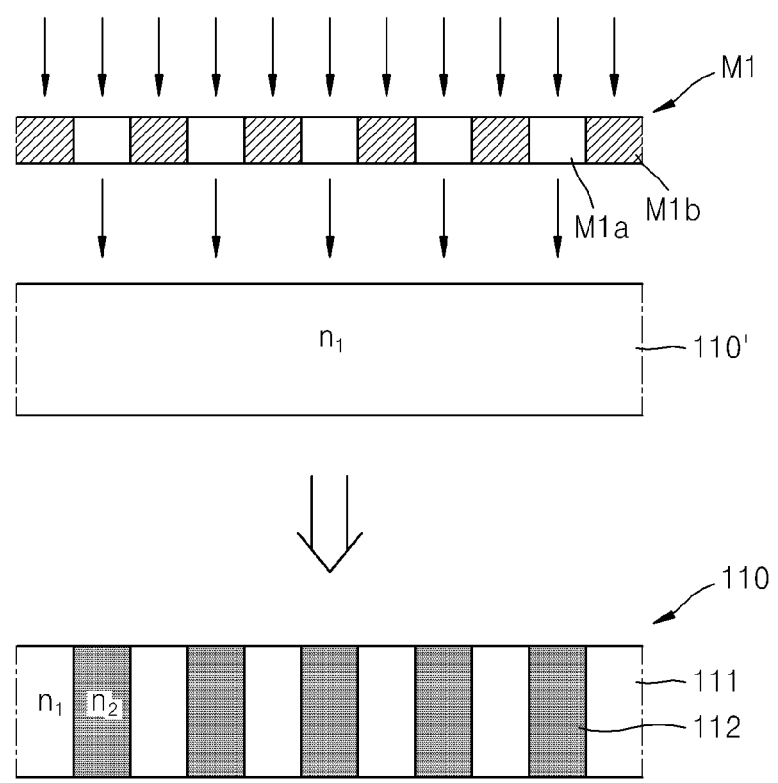
FIG. 12 is a cross-sectional view illustrating a process of an exemplary embodiment of a method of manufacturing the organic light-emitting display apparatus of FIG. 1.

FIG. 12 is a cross-sectional view illustrating an exemplary embodiment of a process of a method of manufacturing the organic light-emitting display apparatus of FIG. 1.

Referring to FIGS. 1 and 12, an exemplary embodiment of a method of manufacturing the organic light-emitting display apparatus 100 of FIG. 1 includes preparing the substrate 110, providing, e.g., forming, the organic light-emitting device OLED by sequentially stacking the first electrode 120, the intermediate layer 130 including the organic emission layer 133 and the second electrode 140 on the substrate 110, and providing the encapsulation unit 150 on the organic light-emitting device OLED.

The first substrate 110 includes the region 111 having the first refractive index $n_1$ and the region 112 having the second refractive index $n_2$ greater than the first refractive index $n_1$, and the region 111 having the first refractive index $n_1$ and the region 112 having the second refractive index $n_2$ may be respectively formed of materials having the same chemical formula.

The providing the intermediate layer 130 may include providing the HTL 132, which may operate as the resonance distance adjusting layer. However, the embodiment is not limited thereto, and the resonance distance adjusting layer may be provided separately.

FIG. 12 is a cross-sectional view illustrating an exemplary embodiment of a method of forming the substrate 110, where light is irradiated to a substrate-forming material 110' for forming the substrate 110 using a mask M1.

The substrate-forming material 110' may include PMMA or glass containing impurities and may have the first refractive index $n_1$. The impurities may include Ge or B.

The mask M1 may include a light transmitting region M1a, which transmits light, and a light blocking region M1b that blocks the light. The light may be ultraviolet ("UV") light.

When irradiating the light on the substrate-forming material 110' using the mask M1, the light is incident only on a region of the substrate-forming material 110' corresponding to the light transmitting region M1a. A chemical bonding of the substrate-forming material 110', e.g., glass containing Ge or the like, is changed according to intensity and/or transmission time of irradiated light, and thus, a refractive index thereof is changed.

Therefore, a refractive index of the region in the substrate-forming material 110' corresponding to the light transmitting region M1a is changed from the first refractive index $n_1$ to the second refractive index $n_2$. The second refractive index $n_2$ may be greater than the first refractive index $n_1$.

The light transmitting region M1a and the light blocking region M1b may have substantially a same width as each other. Accordingly, the substrate 110 included in the organic light-emitting display apparatus 100 of FIG. 1 may be manufactured through such an embodiment of the process.

The substrate 110 may include the region 111 having the first refractive index $n_1$ and the region 112 having the second refractive index $n_2$.

The operation of irradiating light to the substrate-forming material 110' may be performed before the operation of disposing the substrate 110, or may be performed after the operation of forming the encapsulation unit 150. In such an embodiment, the order of performing the operation of irradiating light on the substrate-forming material 110' is not limited.

FIG. 12 illustrates only the mask M1 and the method for manufacturing the substrate 110 included in the organic light-emitting display apparatus 100 of FIG. 1, but the embodiment is not limited thereto.

In an alternative exemplary embodiment, by irradiating light to a substrate-forming material using a mask having a light transmitting region and a light blocking region arranged substantially in a check shape, the substrate 210 of FIG. 3 may be manufactured. In such an embodiment, the light transmitting region and the light blocking region may have different widths from each other.

In another alternative exemplary embodiment, the substrate 310 of FIG. 4 may be manufactured by irradiating light on the substrate-forming material y using a mask having a light transmitting region and a light blocking region which extend substantially in a diagonal direction and are alternately disposed.

FIG. 12 illustrates an exemplary embodiment of the method for manufacturing the substrate 110 including the region 111 having the first refractive index $n_1$ and the region 112 having the second refractive index $n_2$, but the embodiment is not limited thereto. The same process may also be used in a method of providing the encapsulation units 750 and 850 that respectively include the regions 751 and 851 having the first refractive index $n_1$ and the regions 752 and 852 having the second refractive index $n_2$ as shown in FIGS. 8 and 9.

An operation of irradiating light to an encapsulation unit-forming material may be performed before an operation of forming the encapsulation units 750 and 850, or may be performed after the operation of forming the encapsulation units 750 and 850.

Figure 13:
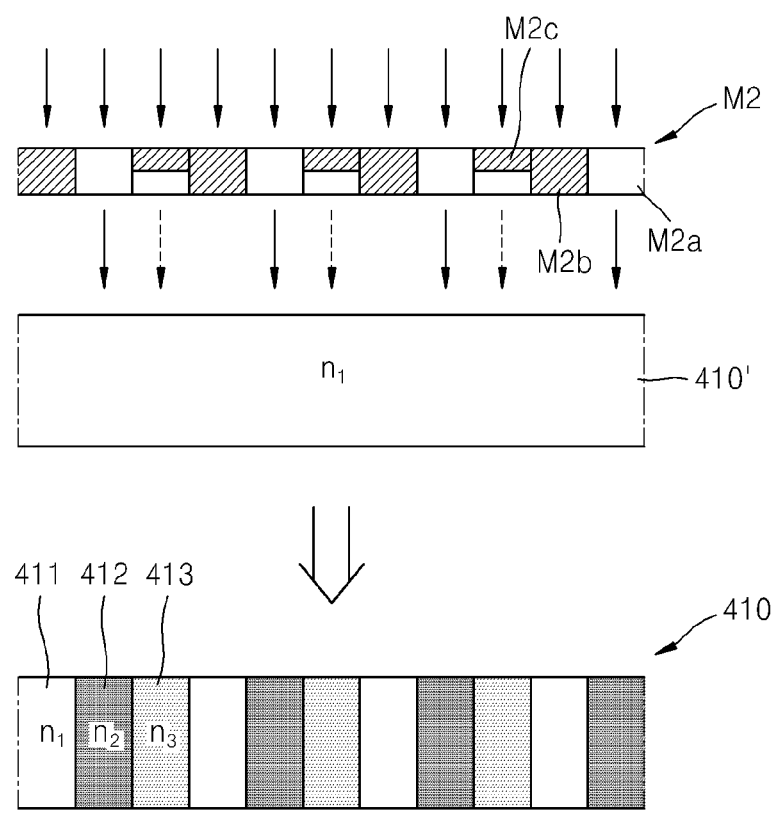
FIG. 13 is a cross-sectional view illustrating an exemplary embodiment of a method of manufacturing the substrate of FIG. 5.

FIG. 13 is a cross-sectional view illustrating an exemplary embodiment of a method of manufacturing the substrate of FIG. 5.

Referring to FIG. 13, light is irradiated to a substrate-forming material 410' for forming the substrate 410 using a mask M2.

The substrate-forming material 410' may include PMMA or glass containing impurities and may have the first refractive index $n_1$. The impurities may include Ge or B.

The mask M2 may be a halftone mask that includes a light transmitting region M2a that transmits light, a light blocking region M2b that blocks light, and a semi-transmissive region M2c that transmits part of light.

When irradiating light to the substrate-forming material 410' using the mask M2, all of the transmitted light is incident on a region of the substrate-forming material 410' corresponding to the light transmitting region M2a, and only some of the transmitted light is incident on a region corresponding to the semi-transmissive region M2c.

Therefore, refractive indexes of the regions of the substrate-forming material 410' respectively corresponding to the light transmitting region M1a and the semi-transmissive region M2c are changed to have different values.

In the substrate 410 manufactured through such a process, a region corresponding to the light blocking region M2b may have the first refractive index $n_1$, a region corresponding to the light transmitting region M2a may have the second refractive index $n_2$, and a region corresponding to the semi-transmissive region M2c may have the third refractive index $n_3$. The third refractive index $n_3$ may be greater than the first refractive index $n_1$ and less than the second refractive index $n_2$.

FIG. 13 shows an exemplary embodiment in which the light transmitting region M2a, the light blocking region M2b and the semi-transmissive region M2c have substantially the same width as each other, but the embodiment is not limited thereto.

That is, the substrate 510 of FIG. 6 may be manufactured using a mask including the light transmitting region M2a, the light blocking region M2b and the semi-transmissive region M2c which have different widths from each other.

Figure 14:
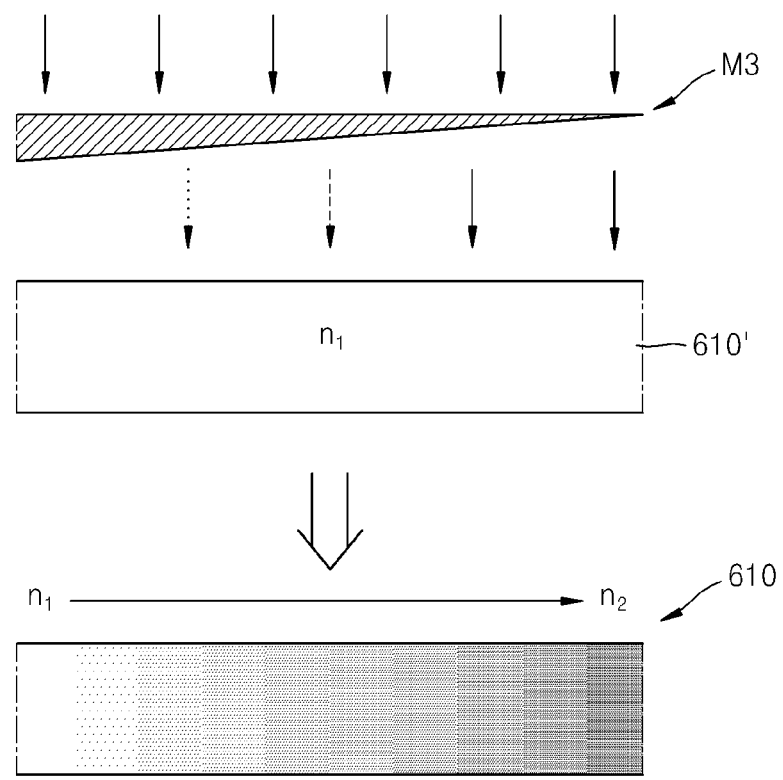
FIG. 14 is a cross-sectional view illustrating an exemplary embodiment of a method of manufacturing the substrate of FIG. 7.

FIG. 14 is a cross-sectional view illustrating an exemplary embodiment of a method of manufacturing the substrate of FIG. 7.

Referring to FIG. 14, light is irradiated to a substrate-forming material 610' for forming the substrate 610 using a mask M3.

The substrate-forming material 610' may include PMMA or glass containing impurities and may have the first refractive index $n_1$. The impurities may include Ge or B.

The mask M3 may be a gradation mask, light transmittance of which is substantially continuously changed.

Therefore, an intensity of light transmitted toward the substrate-forming material 610' is changed according to the light transmittance of the mask M3. The substrate 610 manufactured through such a process may include a region of which refractive index is substantially continuously changed.

The refractive index may have a value substantially continuously changed from the first refractive index $n_1$ to the refractive index $n_2$.

As described above, according to exemplary embodiments of the invention, the organic light-emitting display apparatus and the method of manufacturing the same decrease a color shift and a reduction in luminance caused by a viewing angle.

It should be understood that the exemplary embodiments described therein should be considered in a descriptive sense only and not for purposes of limitation. Descriptions of features or aspects within each embodiment should typically be considered as available for other similar features or aspects in other embodiments.

While various exemplary embodiments of the invention have been described with reference to the figures, it will be understood by those of ordinary skill in the art that various changes in form and details may be made therein without departing from the spirit and scope of the invention as defined by the following claims.

What is claimed is:

1. An organic light-emitting display apparatus comprising:
   a substrate
   an organic light-emitting device comprising:
      a first electrode disposed on the substrate;
      a second electrode disposed opposite the first electrode; and
      an intermediate layer disposed between the first and second electrodes, wherein the intermediate layer comprises an organic emission layer; and
      an encapsulation unit disposed on the organic light-emitting device,
   wherein
   at least one of the substrate and the encapsulation unit, which is disposed in an emission direction of light, comprises a region having a first refractive index and a region having a second refractive index greater than the first refractive index, and the region having the first refractive index and the region having the second refractive index comprise materials having a same chemical formula as each other.

2. The organic light-emitting display apparatus of claim 1, wherein the at least one of the substrate and the encapsulation unit, which is disposed in the emission direction of the light, comprises poly(methyl methacrylate) or glass containing impurities.

3. The organic light-emitting display apparatus of claim 2, wherein the impurities comprise germanium (Ge) or boron (B).

4. The organic light-emitting display apparatus of claim 1, wherein the at least one of the substrate and the encapsulation unit, which is disposed in the emission direction of the light, further comprises a region having a third refractive index different from the first and second refractive indexes, and the regions having the first to third refractive indexes comprise materials having the same chemical formula as each other.

5. The organic light-emitting display apparatus of claim 1, wherein the at least one of the substrate and the encapsulation unit, which is disposed in the emission direction of the light, comprises a region, a refractive index of which is substantially continuously changed.

6. The organic light-emitting display apparatus of claim 1, wherein a width of the region having the first refractive index is substantially the same as a width of the region having the second refractive index.

7. The organic light-emitting display apparatus of claim 1, wherein a width of the region having the first refractive index is different from a width of the region having the second refractive index.

8. The organic light-emitting display apparatus of claim 1, wherein the intermediate layer comprises a resonance distance adjusting layer for adjusting a distance between the first and second electrodes.

9. The organic light-emitting display apparatus of claim 1, wherein the first electrode is a semi-transmissive electrode, the second electrode is a reflective electrode, and the substrate comprises the region having the first refractive index and the region having the second refractive index.

10. The organic light-emitting display apparatus of claim 1, wherein the first electrode is a reflective electrode, the second electrode is a semi-transmissive electrode, and the encapsulation unit protects the organic light-emitting device, and comprises the region having the first refractive index and the region having the second refractive index.

11. The organic light-emitting display apparatus of claim 1, wherein each of the first and second electrodes is a semi-transmissive electrode, and each of the substrate and the encapsulation unit comprises the region having the first refractive index and the region having the second refractive index.

* * * * *